(12) United States Patent
Todorov et al.

(10) Patent No.: US 10,333,407 B2
(45) Date of Patent: Jun. 25, 2019

(54) POWER STAGE PACKAGES OF A MULTI-PHASE DC-DC CONVERTER UNDER A COUPLED INDUCTOR

(71) Applicant: Infineon Technologies Austria AG, Villach (AT)

(72) Inventors: Emil Todorov, Fremont, CA (US); Benjamim Tang, Rancho Palos Verdes, CA (US); Darryl Tschirhart, Torrance, CA (US)

(73) Assignee: Infineon Technologies Austria AG, Villach (AT)

( * ) Notice: Subject to any disclaimer, the term of this patent is extended or adjusted under 35 U.S.C. 154(b) by 696 days.

(21) Appl. No.: 14/705,347

(22) Filed: May 6, 2015

(65) Prior Publication Data

US 2016/0330831 A1  Nov. 10, 2016

(51) Int. Cl.
  *H01F 5/00* (2006.01)
  *H01F 27/28* (2006.01)
  *H02M 3/158* (2006.01)
  *H05K 1/02* (2006.01)
  *H05K 1/18* (2006.01)

(52) U.S. Cl.
  CPC ........ *H02M 3/1584* (2013.01); *H05K 1/0262* (2013.01); *H05K 1/181* (2013.01)

(58) Field of Classification Search
  USPC ...................................................... 336/200
  See application file for complete search history.

(56) References Cited

U.S. PATENT DOCUMENTS 8,004,070 B1  8/2011  Chen
8,471,664 B1  6/2013  Huang et al.
(Continued)

FOREIGN PATENT DOCUMENTS

CN  102088241 A  6/2011
CN  102763179 A  10/2012
(Continued)

OTHER PUBLICATIONS

"60A Power Block Non-Isolated DC-DC Converter", Murata Power Solutions, Okami OKLP-X/60-W12A-C.
(Continued)

*Primary Examiner* — Ronald Hinson
(74) *Attorney, Agent, or Firm* — Murphy, Bilak & Homiller, PLLC

(57) ABSTRACT

A multi-phase DC-DC converter includes a substrate having opposing first and second sides, a plurality of power stage packages attached to the first side of the substrate, each power stage package including active semiconductor components operable to provide an output phase of the multi-phase DC-DC converter, and a coupled inductor attached to the first side of the substrate and at least partly covering two or more of the power stage packages. The coupled inductor includes separate windings wound on the same core. Each winding of the coupled inductor electrically connects an output of one of the power stage packages at least partly covered by the coupled inductor to a metal trace on the substrate such that the outputs of the power stage packages at least partly covered by the coupled inductor are electrically connected to the same metal trace on the substrate.

17 Claims, 9 Drawing Sheets

(56) References Cited

U.S. PATENT DOCUMENTS

| | | | |
|---|---|---|---|
| 9,190,383 B2 | 11/2015 | Cho et al. | |
| 9,281,739 B2 | 3/2016 | Ikriannikov | |
| 9,729,059 B1 | 8/2017 | Parto | |
| 9,742,304 B2* | 8/2017 | Kato | H02M 5/458 |
| 2003/0031339 A1 | 2/2003 | Marshall et al. | |
| 2004/0140877 A1 | 7/2004 | Nakao et al. | |
| 2005/0052888 A1 | 3/2005 | Takeshima et al. | |
| 2006/0279267 A1 | 12/2006 | Burton et al. | |
| 2009/0147541 A1 | 6/2009 | Shimada et al. | |
| 2009/0207574 A1* | 8/2009 | Chen | H05K 1/181 361/761 |
| 2009/0212391 A1 | 8/2009 | Carobolante et al. | |
| 2010/0085139 A1 | 4/2010 | Yan et al. | |
| 2011/0205008 A1* | 8/2011 | Brennan | H01F 27/2847 336/221 |
| 2011/0228507 A1* | 9/2011 | Yin | H01L 23/49531 361/811 |
| 2011/0242775 A1 | 10/2011 | Schaible et al. | |
| 2012/0069529 A1 | 3/2012 | Chen et al. | |
| 2013/0099886 A1 | 4/2013 | Yan et al. | |
| 2014/0062246 A1* | 3/2014 | Langford | H02K 1/2793 310/156.32 |
| 2014/0062446 A1 | 3/2014 | Ikriannikov | |
| 2014/0167900 A1 | 6/2014 | Murtagian et al. | |
| 2014/0239472 A1 | 8/2014 | Jones et al. | |
| 2014/0292459 A1 | 10/2014 | Andres et al. | |
| 2015/0162297 A1 | 6/2015 | Cho et al. | |
| 2015/0194374 A1 | 7/2015 | Ananiev | |
| 2015/0311655 A1 | 10/2015 | Han et al. | |
| 2016/0005528 A1 | 1/2016 | Yan et al. | |
| 2016/0163631 A1 | 6/2016 | Truax et al. | |
| 2016/0164417 A1 | 6/2016 | Ishii et al. | |

FOREIGN PATENT DOCUMENTS

| | | |
|---|---|---|
| CN | 103081325 A | 5/2013 |
| CN | 103227172 A | 7/2013 |
| CN | 103325783 A | 9/2013 |
| CN | 103367361 A | 10/2013 |
| CN | 103680861 A | 3/2014 |
| CN | 104051128 A | 9/2014 |
| EP | 2866533 A1 | 4/2015 |
| JP | 2005102485 A | 4/2005 |
| JP | 2005522173 A | 7/2005 |
| JP | 2008092653 A | 4/2008 |
| JP | 2008112941 A | 5/2008 |
| JP | 3147172 U | 11/2008 |
| JP | 2011019083 A | 1/2011 |
| JP | 2012109518 A | 6/2012 |
| WO | 03085476 A1 | 10/2003 |
| WO | 2015074247 A1 | 5/2015 |

OTHER PUBLICATIONS

"Programmable Output 12-Amp iLGA SMT PoL DC-DC Converter Series", Murata Power Solutions, Okami OKL2-T/12-W12 Series.
"Programmable Output 3-Amp iLGA SMT PoLs", Murata Power Solutions, Okami OKL-T/3-W5 Series.

* cited by examiner

POWER STAGE PACKAGES OF A MULTI-PHASE DC-DC CONVERTER UNDER A COUPLED INDUCTOR

TECHNICAL FIELD

The instant application relates to multi-phase DC-DC converters, and more particularly to optimal placement of multi-phase DC-DC converter components on a circuit board.

BACKGROUND

Multi-phase DC-DC converters include several active and passive components, including power stage packages, for regulating the voltage of a load such as a processor. Each power stage package is coupled to the load by an output inductor. The components of a multi-phase DC-DC converter, including the output inductors, are attached to a printed circuit board (PCB) together with the load. The PCB has various electrical pathways for electrically interconnecting the DC-DC converter components, including electrically connecting the power stage packages of the converter to the load. DC-DC converter power stage packages are conventionally attached to a PCB in the same plane as the output inductors, increasing the size of the PCB. Also, conventional layout design practices for PCBs further complicate such an arrangement of the multi-phase DC-DC converter components.

SUMMARY

According to an embodiment of a multi-phase DC-DC converter, the multi-phase DC-DC converter comprises a substrate having opposing first and second sides, a plurality of power stage packages attached to the first side of the substrate, each power stage package comprising active semiconductor components operable to provide an output phase of the multi-phase DC-DC converter, and a coupled inductor attached to the first side of the substrate and at least partly covering two or more of the power stage packages. The coupled inductor comprises separate windings wound on the same core. Each winding of the coupled inductor electrically connects an output of one of the power stage packages at least partly covered by the coupled inductor to a metal trace on the substrate such that the outputs of the power stage packages at least partly covered by the coupled inductor are electrically connected to the same metal trace on the substrate.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

According to embodiments described herein, the power stage packages of a multi-phase DC-DC converter are placed under one or more coupled inductors. Each power stage package comprises active semiconductor components such as power transistors and corresponding driver circuitry for providing an output phase of the multi-phase DC-DC converter, by delivering a phase current through the winding of a coupled inductor or through a single inductor to the load regulated by the multi-phase DC-DC converter. Each power stage package can include active semiconductor components such as MOSFETs (metal oxide semiconductor field effect transistors), drivers, etc. and corresponding passive components. The passive components can be excluded from the package and provided as separate components. In each case, the power stage packages include at least the active semiconductor components needed to provide an output phase of the multi-phase DC-DC converter to the load and are placed under a coupled inductor or single inductor of the converter when attached to a circuit board such as a PCB to form a DC-DC converter assembly. For example, each power stage package can have a high-side transistor and a low-side transistor for coupling to the load through the corresponding coupled inductor winding or single inductor. The high-side transistor of each power stage switchably connects the load to an input voltage of the multi-phase DC-DC converter and the corresponding low-side transistor switchably connects the load to ground at different periods.

Figure 1A:
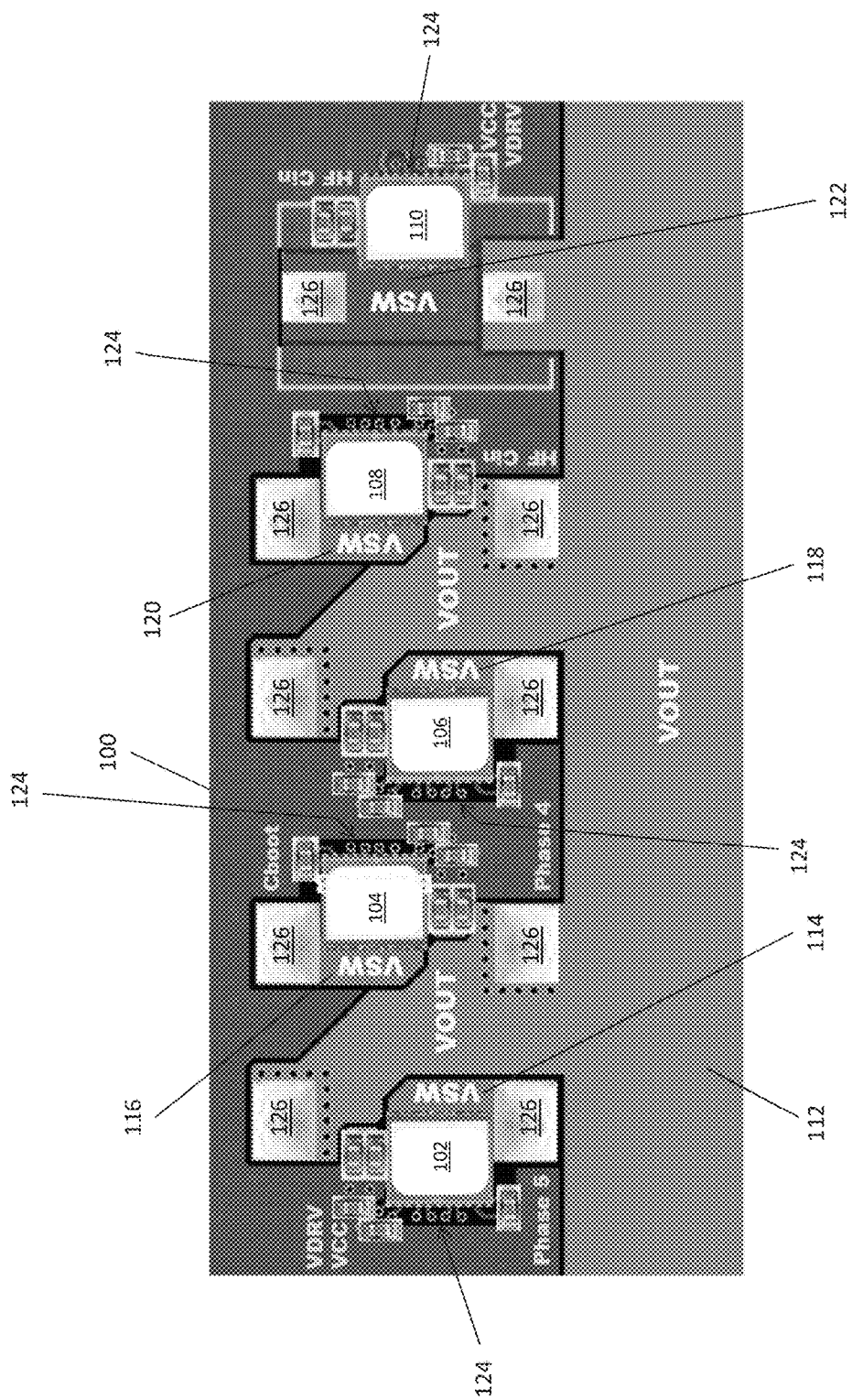
FIG. 1A illustrates a top plan view of a section of a substrate such as a PCB to which components of a multi-phase DC-DC converter are attached, according to an embodiment.

FIG. 1A illustrates a top-down plan view of a section of a substrate 100 such as a PCB to which components of a multi-phase DC-DC converter are attached. The components of the multi-phase DC-DC converter include various capacitors (VDRV, VCC, 'Phase 5', 'Phase 4', Cboot, 'HF Cin') and the power stage packages 102, 104, 106, 108, 110 which deliver the phase currents to the load regulated by the multi-phase DC-DC converter. The load can be a high-performance integrated circuit such as a microprocessor, graphics processor, network processor, etc. or other type of integrated circuit requiring voltage regulation such as a POL (point-of-load). The load is not shown in FIG. 1A for ease of illustration.

At least some of the power stage packages 102, 104, 106, 108 deliver phase current to the load through a winding of a coupled inductor attached to the substrate 100. Optionally, at least one of the power stage packages 110 can deliver phase current to the load through a single inductor attached to the substrate 100. Alternatively, only coupled inductors are used. FIG. 1A shows the substrate 100 prior to inductor attachment.

Five power stage packages 102, 104, 106, 108, 110 are shown in FIG. 1A, and one of the power stage packages 110 is active during light load operation i.e. when load current demand is low. In general, the multi-phase DC-DC converter has at least two power stage packages attached to the substrate 100. Each power stage package 102, 104, 106, 108, 110 comprises active semiconductor components such as power transistors and corresponding driver circuitry for providing an output phase of the multi-phase DC-DC converter. The components of each power stage package 102, 104, 106, 108, 110 can be monolithically integrated in the same semiconductor die or packaged as a multi-chip module. The outputs (VSW) of the power stage packages 102, 104, 106, 108, 110 are electrically isolated, but connected to the same output metal trace VOUT 112 through the inductor windings.

Figure 1B:
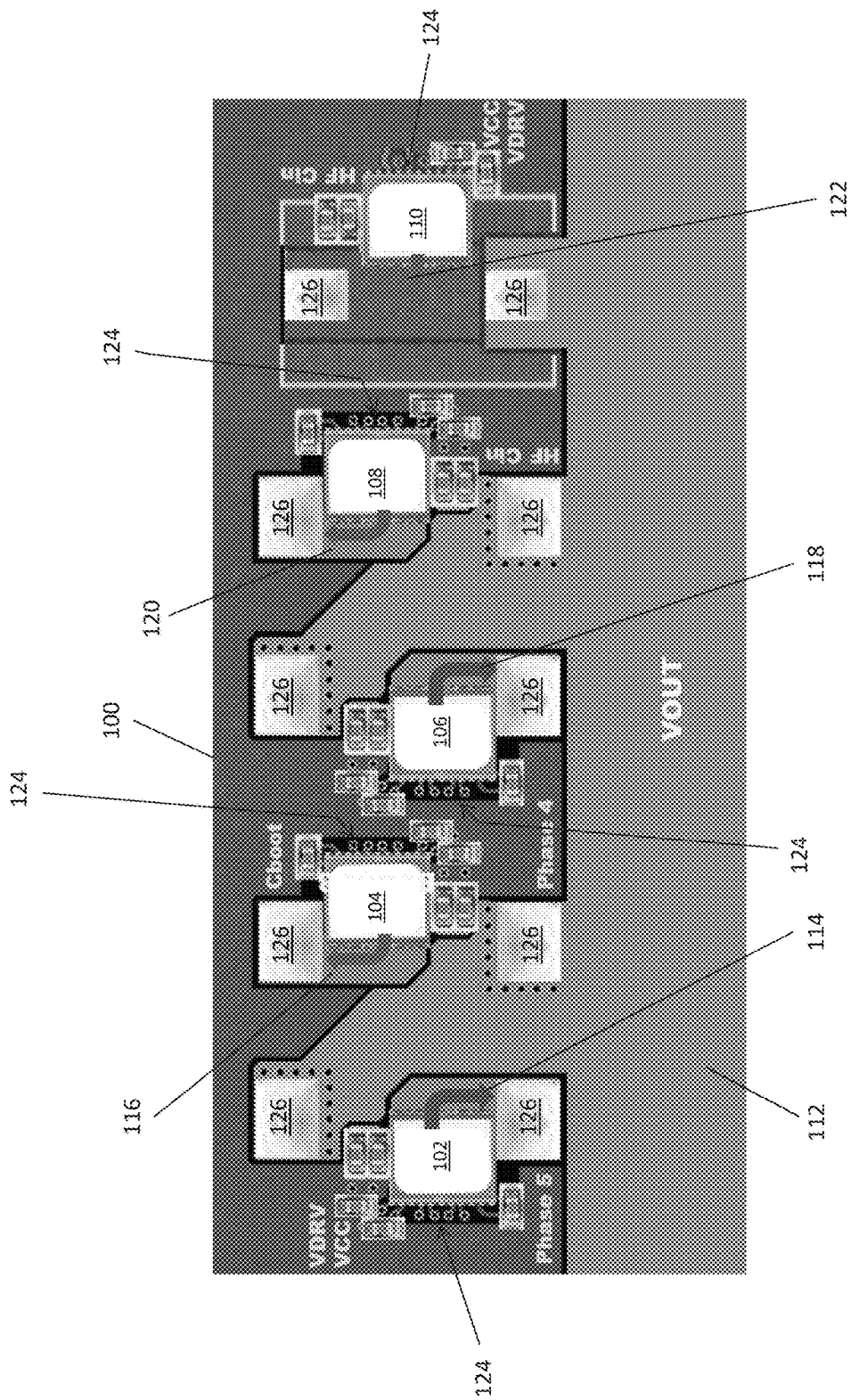
FIG. 1B shows the substrate of FIG. 1A with superimposed phase current flows.

FIG. 1B shows the substrate 100 of FIG. 1 with superimposed phase current flows. The output (VSW) of each power stage package 102, 104, 106, 108, 110 is electrically connected to a separate metal trace 114, 116, 118, 120, 122 of the substrate 100. The corresponding phase current flows into the respective metal traces 114, 116, 118, 120, 122 in the directions indicted by the arrows in FIG. 1B, owing to the 180 degree rotated orientation of the adjacent power stage packages 102, 104, 106, 108, 110 on the substrate 100. This way, one side of each power stage package 102, 104, 106, 108, 110 which has input/output (I/O) pins or terminals faces 124 away from the same side of the adjacent power stage package 102, 104, 106, 108, 110. Each phase current flows into one terminal of a winding of a coupled inductor or a single inductor, and out the opposite terminal which is connected to the common metal (output) trace 112 of the substrate 100 to yield the output (Vout) of the multi-phase DC-DC converter. The substrate 100 includes metal pads or landings 126 on the same side of the substrate 100 as the power stage packages 102, 104, 106, 108, 110 for attaching the inductor components of the multi-phase DC-DC converter.

Figure 1C:
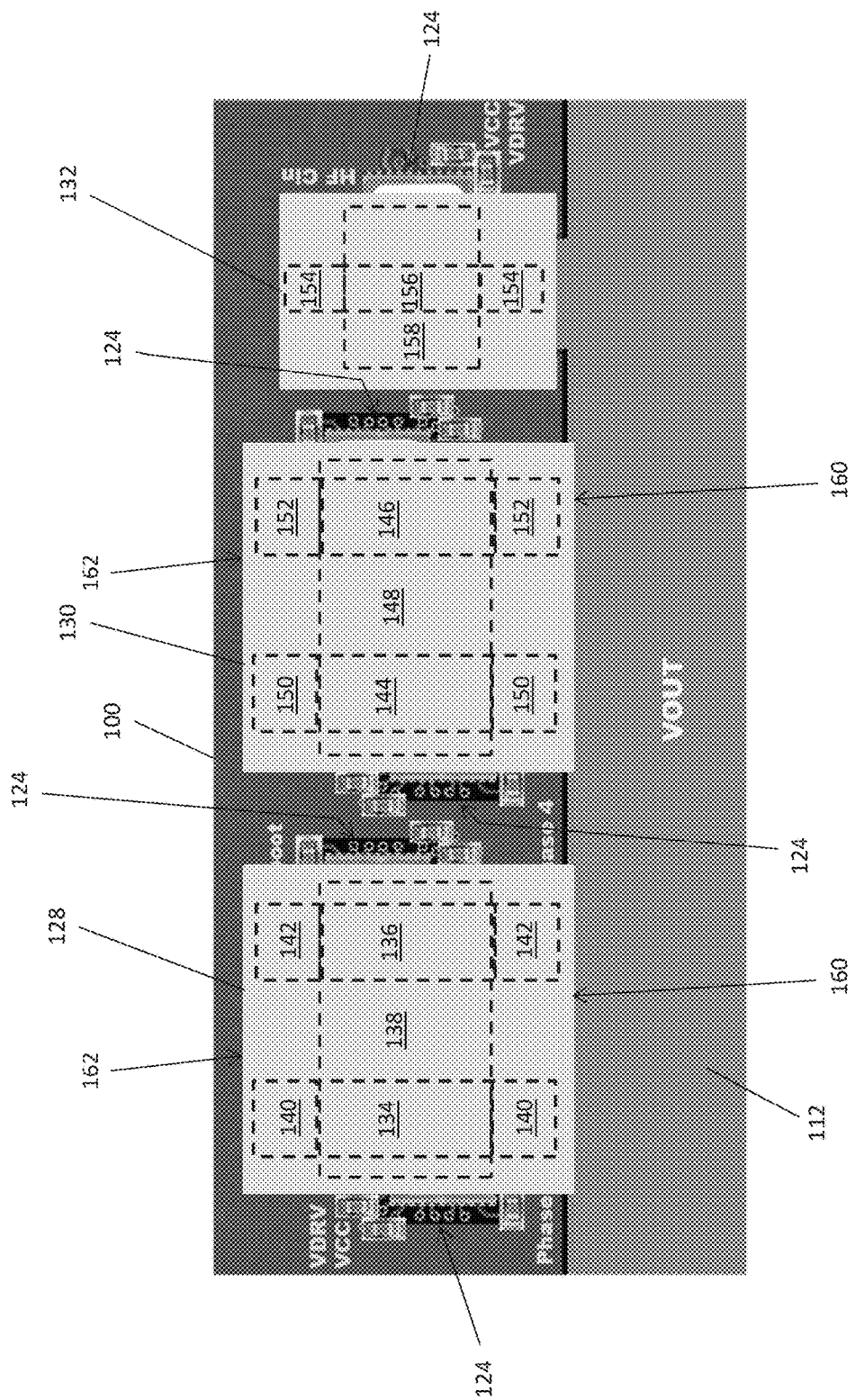
FIG. 1C shows the substrate of FIG. 1A after the inductor components of the multi-phase DC-DC converter are attached to the substrate so as to at least partly cover the power stage packages of the multi-phase DC-DC converter.

FIG. 1C shows the substrate 100 of FIG. 1A after the output inductor components 128, 130, 132 of the multi-phase DC-DC converter are attached to the substrate 100. According to this embodiment, a first coupled inductor 128 is attached to the same side of the substrate 100 as the first and second power stage packages 102, 104 and at least partly covers these two power stage packages 102, 104. This means that the first coupled inductor 128 and the first and second power stage packages 102, 104 have overlapping footprints so that when the first coupled inductor 128 is mounted or soldered to the substrate 100, the first coupled inductor 128 provides sufficient clearance such that the first and second power stage packages 102, 104 are underneath and fully or partially covered by the first coupled inductor 128. The first coupled inductor 128 comprises two separate windings 134, 136 wound on the same core 138. Each winding 134, 136 has a pair of terminals 140, 142 attached to the corresponding metal pads/landings 126 on the substrate 100. The windings 134, 136, core 138 and terminals 140, 142 of the first coupled inductor 128 are out of view in FIG. 1C, and therefore illustrated with dashed boxes.

The first power stage package 102 is disposed in a gap between the terminals 140 of the first winding 134, and the second power stage package 104 is disposed in a gap between the terminals 142 of the second winding 136. The first winding 134 electrically connects the output of the first power stage package 102 to the common metal output trace 112 of the substrate 100. The second winding 136 similarly electrically connects the output of the second power stage package 104 to the common metal output trace 112 of the substrate 100. The phase currents flow in the opposite direction in the first coupled inductor 128 as indicated by the corresponding arrows shown in FIG. 1B, due to the 180 degree rotated orientation of the first and second power stage packages 102, 104.

According to this embodiment, a second coupled inductor 130 is attached to the same side of the substrate 100 as the third and fourth power stage packages 106, 108 and at least partly covers these two power stage packages 106, 108. The second coupled inductor 130 comprises two separate windings 144, 146 wound on the same core 148. Each winding 144, 146 of the second coupled inductor 130 has a pair of terminals 150, 152 attached to the corresponding metal pads/landings 126 on the substrate 100. The windings 144, 146, core 148 and terminals 150, 152 of the second coupled inductor 130 are out of view in FIG. 1C, and therefore illustrated with dashed boxes.

The third power stage package 106 is disposed in a gap between the terminals 150 of the first winding 144 of the second coupled inductor 130, and the second power stage package 108 is disposed in a gap between the terminals 152 of the second winding 146 of the second coupled inductor 130. The first winding 144 of the second coupled inductor 130 electrically connects the output of the third power stage package 106 to the common metal output trace 112 of the substrate 100. The second winding 146 of the second coupled inductor 130 similarly electrically connects the output of the fourth power stage package 108 to the common metal output trace 112 of the substrate 100. As is the case with the first coupled inductor 128, the phase currents flow in the opposite direction in the second coupled inductor 130 as indicated by the corresponding arrows shown in FIG. 1B due to the 180 degree rotated orientation of the third and fourth power stage packages 106, 108.

A fifth power stage package 110 is at least partly covered by a single inductor 132 attached to the same side of the substrate 100 as the fifth power stage package 110. The terminals 154 of the single inductor 132 are attached to the corresponding metal pads/landings 126 on the substrate 100. The winding 156, core 158 and terminals 154 of the single inductor 132 are out of view in FIG. 1C, and therefore illustrated with dashed boxes. The fifth power stage package 110 can be active during light load operation. In one embodiment, the single inductor 132 has a higher open circuit inductance than each separate winding 134, 136, 144, 146 of the coupled inductors 128, 130 to ensure higher efficiency during light load operation.

According to the embodiment shown in FIG. 1C, each power stage package 102, 104, 106, 108 at least partly covered by a coupled inductor 128, 130 along a first half of that coupled inductor 128, 130 has an orientation which is rotated 180 degrees from the orientation of each power stage package 102, 104, 106, 108 at least partly covered by the same coupled inductor 128, 130 along a second half of the coupled inductor 128, 130. This way, one side of each these power stage packages 102, 104, 106, 108 has input/output (I/O) pins or terminals 124 which face away from the same side of the adjacent power stage package 102, 104, 106, 108 at least partly covered by the same coupled inductor 128, 130.

If these opposing sides of the power stages packages 102, 104, 106, 108 are not completely covered by the corresponding coupled inductor 128, 130 as shown in FIG. 1C, one or more terminals 124 of each power stage package 102, 104, 106, 108 disposed under a coupled inductor 128, 130 remain uncovered by that coupled inductor 128, 130. In addition or alternatively, the single inductor 132 does not completely cover the fifth power stage package 110 disposed under the single inductor 132 such that one or more terminals 124 of the fifth power stage package 110 are uncovered by the single inductor 132. Such an arrangement of the power stage packages 102, 104, 106, 108, 110 and inductor components 128, 130, 132 of the multi-phase DC-DC converter allows for visual inspection of at least some of the pins/terminals 124 of the power stage packages 102, 104, 106, 108, 110 after solder reflow.

Further according to the embodiment shown in FIGS. 1A through 1C, the common metal output trace 112 of the substrate 100 extends under each coupled inductor 128, 132 from a first edge face 160 of the coupled inductors 128, 132 to a second edge face 162 of the coupled inductors 128, 130 which is opposite the first edge face 160. Also, each power stage package 102, 104, 106, 108 disposed under a coupled inductor 128, 130 is at least partly covered by a different half of the coupled inductor 128, 130 than the other power stage package 102, 104, 106, 108 disposed under the same coupled inductor 128, 130.

The three separate inductor components 128, 130, 132 shown in FIG. 1C can be consolidated into two inductor components or a single inductor component.

Figure 2:
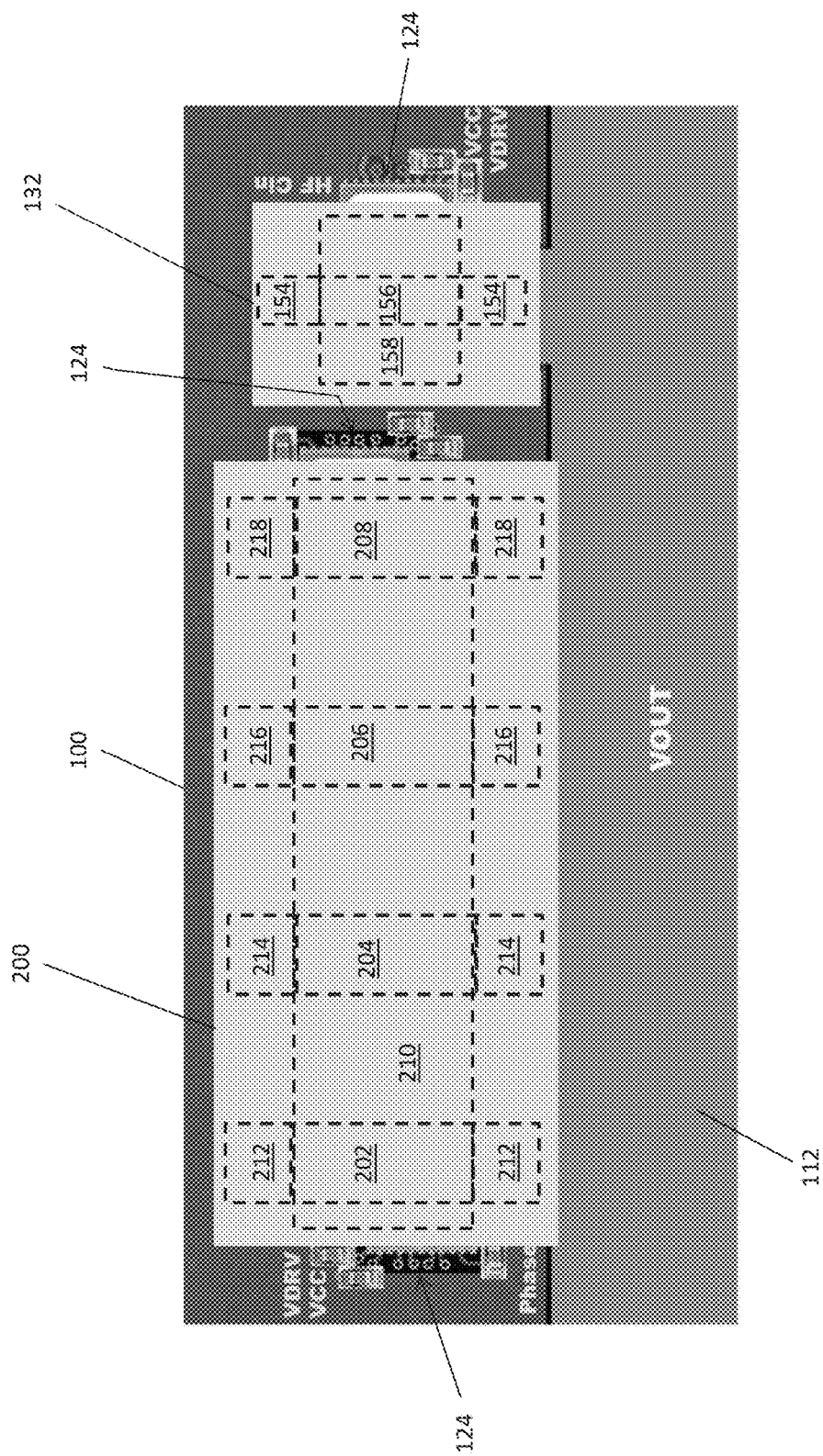
FIG. 2 illustrates a top plan view of a section of a substrate such as a PCB to which components of a multi-phase DC-DC converter are attached, according to another embodiment.

FIG. 2 illustrates another embodiment of the multi-phase DC-DC converter in which a 4-winding coupled inductor 200 replaces the first and the second coupled inductors 128, 132 shown in FIG. 1C. According to this embodiment, the 4-winding coupled inductor 200 has four separate windings (inductors) 202, 204, 206, 208 wound on the same core 210. Each winding 202, 204, 206, 208 has a pair of terminals 212, 214, 216, 218 attached to the corresponding metal pads/landings 126 on the substrate 100. The windings 202, 204, 206, 208, core 210 and terminals 212, 214, 216, 218 of the 4-winding coupled inductor 200 are out of view in FIGS. 2, and therefore illustrated with dashed boxes. The first through the fourth power stage packages 102, 104, 106, 108 are at least partly covered by the 4-winding coupled inductor 200 according to this embodiment.

Figure 3:
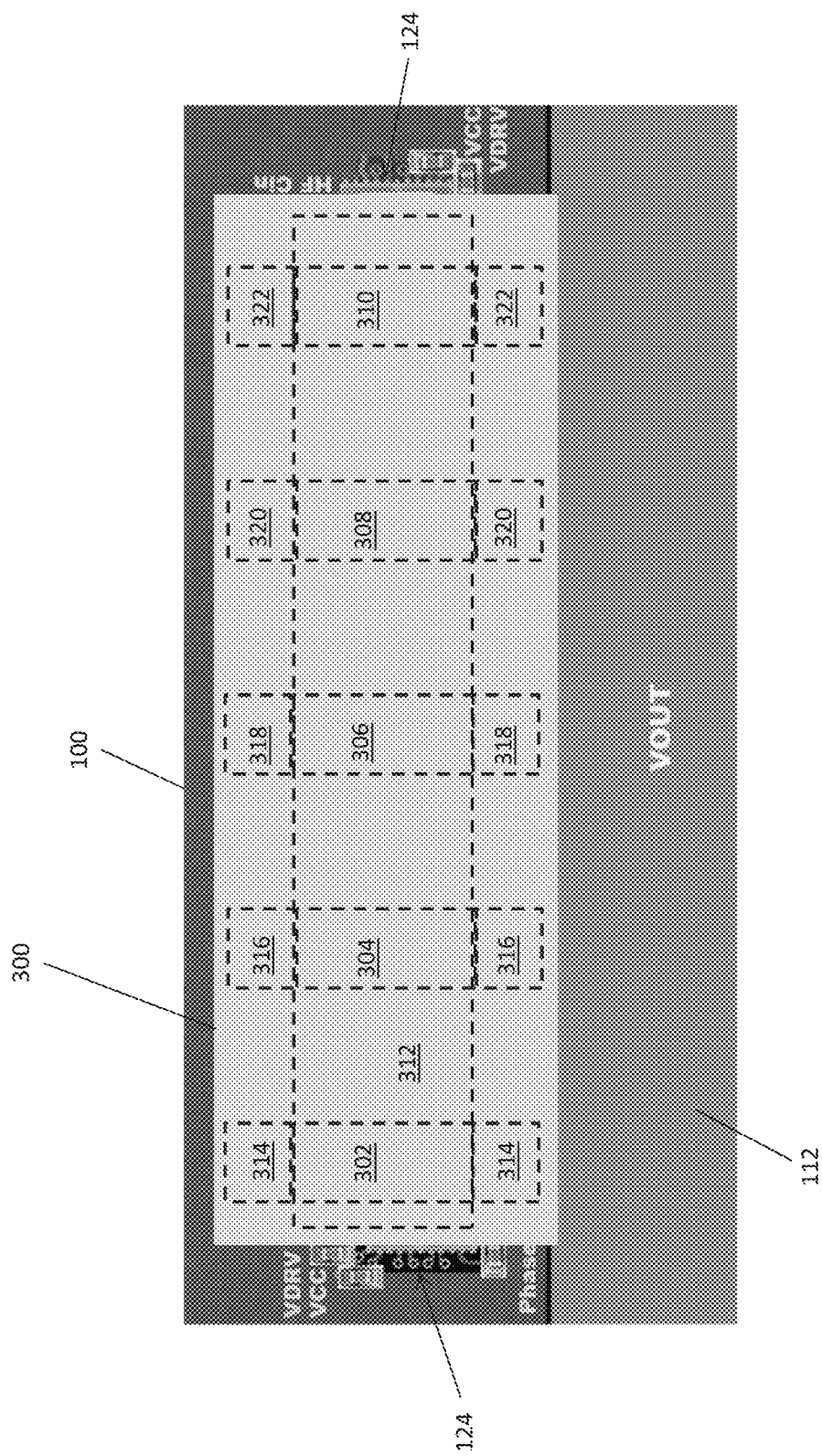
FIG. 3 illustrates a top plan view of a section of a substrate such as a PCB to which components of a multi-phase DC-DC converter are attached, according to yet another embodiment.

FIG. 3 illustrates yet another embodiment of the multi-phase DC-DC converter in which a 5-winding coupled inductor 300 replaces the first and the second coupled inductors 128, 130 and the single inductor 132 shown in FIG. 1C. According to this embodiment, the 5-winding coupled inductor 300 has five separate windings (inductors) 302, 304, 306, 308, 310 wound on the same core 312. Each winding 302, 304, 306, 308, 310 has a pair of terminals 314, 316, 318, 320, 322 attached to the corresponding metal pads/landings 126 on the substrate 100. The windings 302, 304, 306, 308, 310, core 312 and terminals 314, 316, 318, 320, 322 of the five-winding coupled inductor 300 are out of view in FIGS. 3, and therefore illustrated with dashed boxes. All power stage packages 102, 104, 106, 108, 110 of the multi-phase DC-DC converter are at least partly covered by the 5-winding coupled inductor 300 according to this embodiment.

Figure 4:
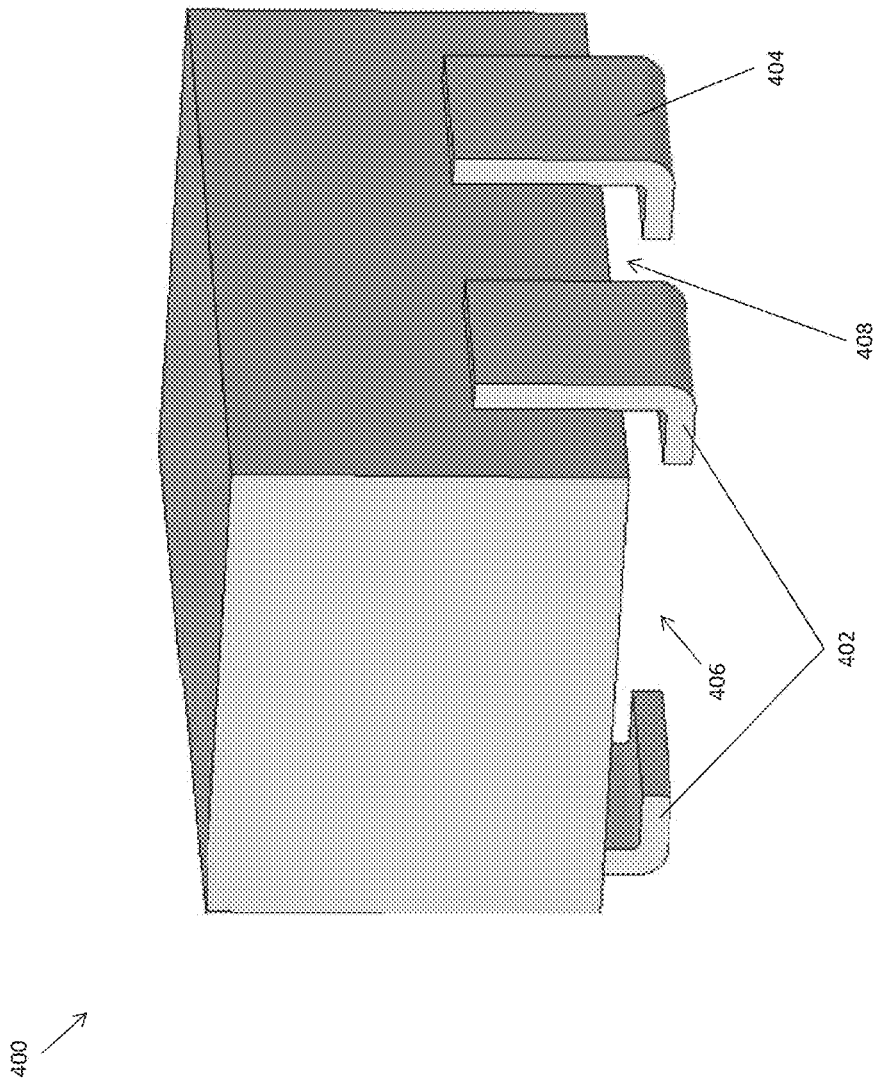
FIG. 4 illustrates a perspective view of a coupled inductor which can accommodate two power stage packages of a multi-phase DC-DC converter under the inductor.

FIG. 4 illustrates an embodiment of a 2-winding coupled inductor 400. The 2-winding coupled inductor 400 includes two windings (out of view) wound on the same core (also out of view). Each winding has a pair of terminals 402, 404. Two power stages of a multi-phase DC-DC converter could be positioned under the 2-winding coupled inductor 400. For example, a first power stage package can be positioned in a gap 406 between the first pair of terminals 402 and a second power stage package can be positioned in a gap 408 between the second pair of terminals 404. The power stage packages are not shown in FIG. 4 for ease of illustration.

In general, at least two power stage packages of a multi-phase DC-DC converter are disposed under the same coupled inductor. For example, two, three, four, five or six power stage packages of a multi-phase DC-DC converter can be disposed under the same coupled inductor. The coupled inductor comprises a separate winding for each power stage package, and the windings are wound on the same core. The windings electrically connect the respective outputs of the power stage packages to the same metal trace on the substrate.

Unlike a single inductor, a coupled inductor has at least two separate windings (inductors) wound on the same core, enabling a more efficient and reduced footprint design of a multi-phase DC-DC converter. The coupled inductor can completely or partly cover each power stage package disposed under that coupled inductor. The power stage packages can be surface mount devices (SMDs) and the coupled inductor dimensions allow the power stage packages to fit under the coupled inductor e.g. in the gap between windings terminals while also permitting sufficient air flow around the power stage packages. Described next are additional embodiments of coupled inductors which can accommodate two or more power stage packages of a multi-phase DC-DC converter as explained above.

Figure 5:
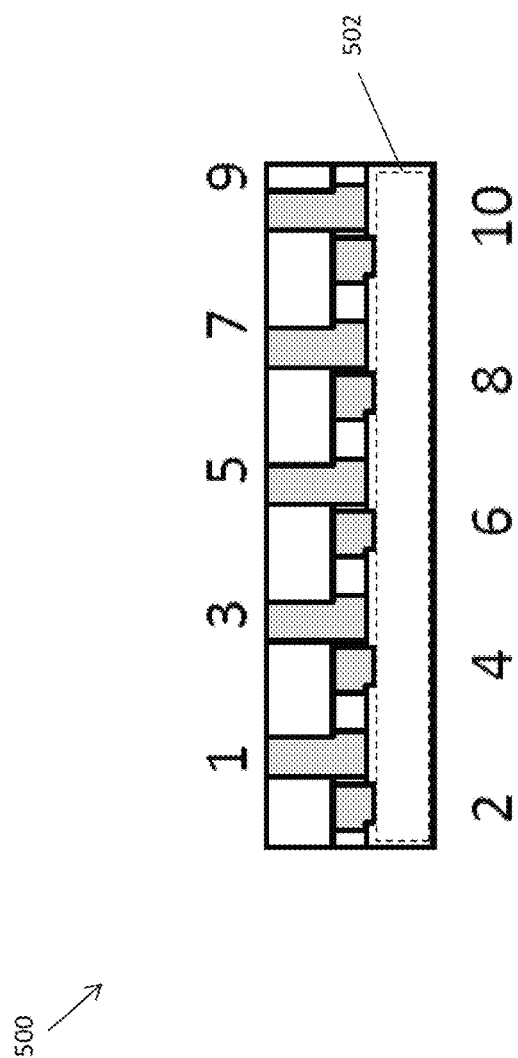
FIG. 5 illustrates a bottom plan view of a 5-winding coupled inductor which can accommodate five power stage packages of a multi-phase DC-DC converter under the inductor, according to an embodiment.

FIG. 5 shows a bottom plan view of a 5-winding coupled inductor 500. The side of the 5-winding coupled inductor visible in FIG. 5 is the side which faces the substrate to which the coupled inductor 500 is to be attached. The 5-winding coupled inductor 500 includes a pair of terminals 1/2, 3/4, 5/6, 7/8, 9/10 for each winding of the inductor. The windings and core of the coupled inductor 500 are out of view in FIG. 5. According to this embodiment, none of the terminal pairs 1/2, 3/4, 5/6, 7/8, 9/10 are disposed on a first half 502 of the 5-winding coupled inductor 500 which will face the substrate to which the coupled inductor 500 is to be attached.

Figure 6:
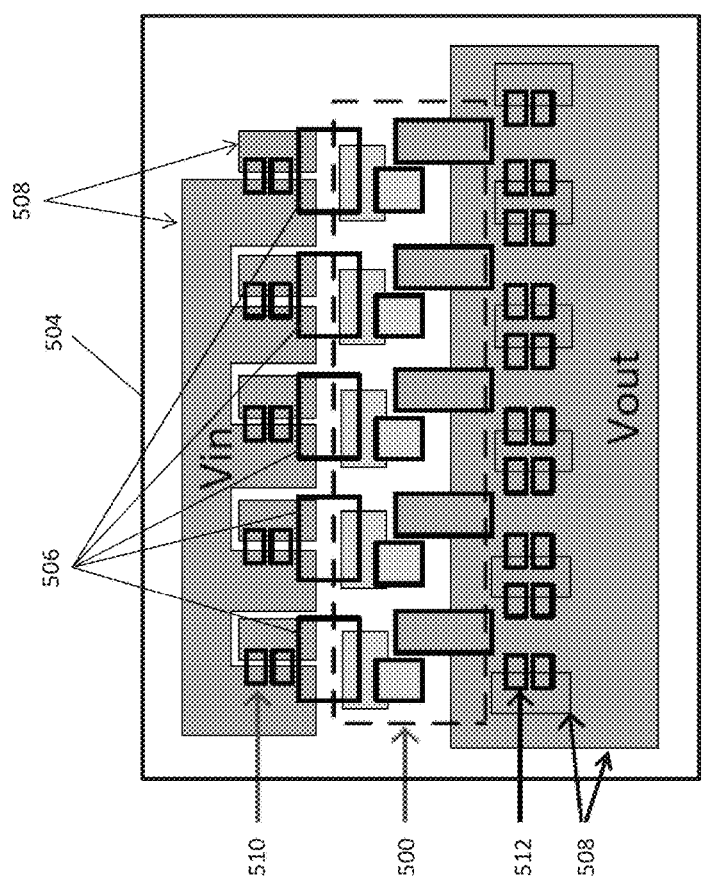
FIG. 6 illustrates a layout view of a substrate to which the 5-winding coupled inductor of FIG. 5 and five power stage packages of a multi-phase DC-DC converter are to be attached.

FIG. 6 shows a substrate 504 such as a PCB to which the 5-winding coupled inductor 500 is to be attached. Five power stage packages 506 of a multi-phase DC-DC converter are attached to the same side of the substrate 504 to which the 5-winding coupled inductor 500 is to be attached. The substrate 504 includes metal traces 508 for providing input (Vin) and output (Vout) electrical connections to the power stage packages 506 and electrical connections to the terminal pairs 1/2, 3/4, 5/6, 7/8, 9/10 of the 5-winding coupled inductor 500. Input and output capacitors 510, 512 for the power stage packages 506 are also shown. The footprint of the 5-winding coupled inductor 500 is illustrated as a dashed box in FIG. 6.

Figure 7:
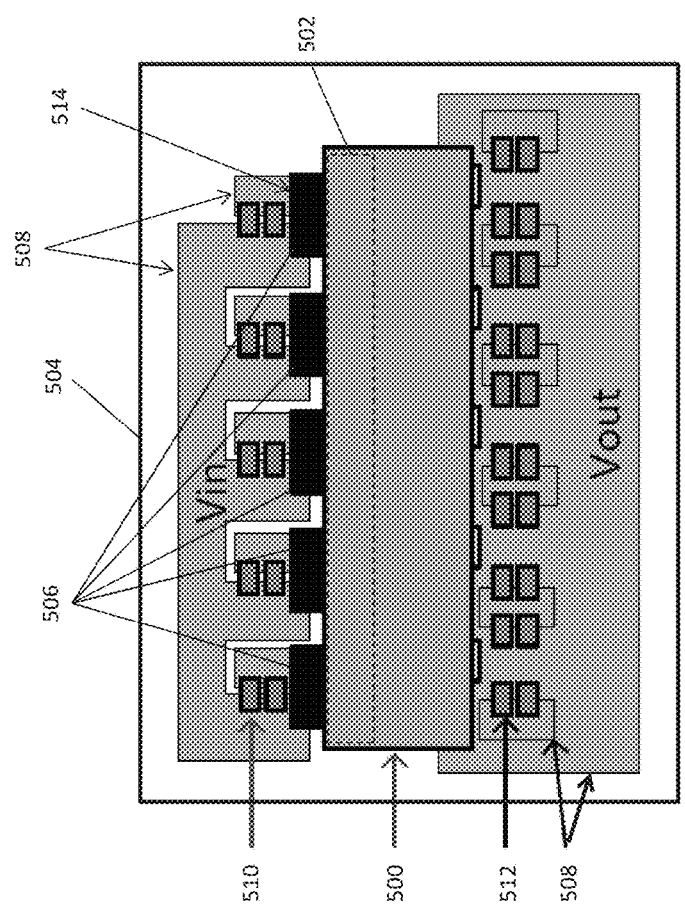
FIG. 7 illustrates a layout view of the substrate of FIG. 6 after the 5-winding coupled inductor is attached to the substrate so as to at least partly cover the five power stage packages of the multi-phase DC-DC converter.

FIG. 7 shows the substrate 504 after the 5-winding coupled inductor 500 is attached to the same side of the substrate 504 as the power stage packages 506. Each power stage package 506 is at least partly covered by the 5-winding coupled inductor 500. Also, each power stage package 506 is disposed under the first half 502 of the coupled inductor 500 i.e. the half 502 at which none of the winding terminal pairs 1/2, 3/4, 5/6, 7/8, 9/10 is disposed. At least one side 514 of the power stage packages 506 extends out from under the 5-winding coupled inductor 500, and therefore is visible for inspection after solder reflow. The coupled inductor 500 can have more or less than 5 windings (inductors) wound on the same core, depending on the number of converter phases and various substrate design and layout considerations involved. Other winding terminal configurations are also possible. For example, the power stage packages 506 can be positioned under a coupled inductor in gaps between the winding terminals as shown in FIG. 1-3.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A multi-phase DC-DC converter, comprising:
a substrate having opposing first and second sides;
a plurality of power stage packages attached to the first side of the substrate, each power stage package comprising active semiconductor components operable to provide an output phase of the multi-phase DC-DC converter; and
a coupled inductor attached to the first side of the substrate and at least partly covering two or more of the power stage packages, the coupled inductor comprising separate windings wound on the same core,
wherein each winding of the coupled inductor electrically connects an output of one of the power stage packages at least partly covered by the coupled inductor to a metal trace on the substrate such that the outputs of the power stage packages at least partly covered by the coupled inductor are electrically connected to the same metal trace on the substrate,
wherein each power stage package at least partly covered by the coupled inductor along a first half of the coupled inductor has an orientation which is rotated 180 degrees from the orientation of each power stage package at least partly covered by the coupled inductor along a second half of the coupled inductor,
wherein a side of each power stage package at least partly covered by the coupled inductor which has input/output pins or terminals faces away from the same side of the adjacent power stage package.

2. The multi-phase DC-DC converter of claim 1, wherein the coupled inductor does not completely cover the power stage packages disposed under the coupled inductor such that one or more terminals of the power stage packages under the coupled inductor are uncovered by the coupled inductor.

3. The multi-phase DC-DC converter of claim 1, wherein the metal trace extends under the coupled inductor from a first edge face of the coupled inductor to a second edge face of the coupled inductor which is opposite the first edge face.

4. The multi-phase DC-DC converter of claim 1, wherein each winding of the coupled inductor has a pair of terminals, and wherein the power stage packages are disposed in gaps between the terminals.

5. The multi-phase DC-DC converter of claim 1, wherein each winding of the coupled inductor has a pair of terminals, wherein none of the terminals are disposed on a first half of the coupled inductor which faces the substrate, and wherein each power stage package at least partly covered by the coupled inductor is disposed under the first half of the coupled inductor.

6. The multi-phase DC-DC converter of claim 1, wherein two of the power stage packages are at least partly covered by the coupled inductor, wherein the coupled inductor comprises two separate windings wound on the same core, and wherein each of the two windings electrically connects the output of one of the two power stage packages to the same metal trace on the substrate.

7. The multi-phase DC-DC converter of claim 6, wherein a first one of the two power stage packages is at least partly covered by a different half of the coupled inductor than a second one of the two power stage packages.

8. The multi-phase DC-DC converter of claim 1, wherein at least two of the power stage packages are at least partly covered by the coupled inductor, wherein the coupled inductor comprises at least two separate windings wound on the same core, and wherein each of the at least two windings electrically connects the output of one of the at least two power stage packages to the same metal trace on the substrate.

9. The multi-phase DC-DC converter of claim 8, wherein three of the power stage packages are at least partly covered by the coupled inductor, wherein the coupled inductor comprises three separate windings wound on the same core, and wherein each of the three windings electrically connects the output of one of the three power stage packages to the same metal trace on the substrate.

10. The multi-phase DC-DC converter of claim 8, wherein four of the power stage packages are at least partly covered by the coupled inductor, wherein the coupled inductor comprises four separate windings wound on the same core, and wherein each of the four windings electrically connects the output of one of the four power stage packages to the same metal trace on the substrate.

11. The multi-phase DC-DC converter of claim 8, wherein five of the power stage packages are at least partly covered by the coupled inductor, wherein the coupled inductor comprises five separate windings wound on the same core, and wherein each of the five windings electrically connects the output of one of the five power stage packages to the same metal trace on the substrate.

12. The multi-phase DC-DC converter of claim 8, wherein six of the power stage packages are at least partly covered by the coupled inductor, wherein the coupled inductor comprises six separate windings wound on the same core, and wherein each of the six windings electrically connects the output of one of the six power stage packages to the same metal trace on the substrate.

13. The multi-phase DC-DC converter of claim 1, further comprising an additional coupled inductor attached to the first side of the substrate and comprising separate windings wound on the same core, wherein at least a first and a second one of the power stage packages are at least partly covered by the coupled inductor, and wherein at least a third and a fourth one of the power stage packages are at least partly covered by the additional coupled inductor.

14. The multi-phase DC-DC converter of claim 1, further comprising:
   a first single inductor separate from the coupled inductor and attached to the first side of the substrate, the first single inductor at least partly covering one of the power stage packages.

15. The multi-phase DC-DC converter of claim 14, wherein the power stage package at least partly covered by the first single inductor is active during light load operation of the multi-phase DC-DC converter.

16. The multi-phase DC-DC converter of claim 14, wherein the first single inductor does not completely cover the power stage package disposed under the first single inductor such that one or more terminals of the power stage package under the first single inductor are uncovered by the first single inductor.

17. The multi-phase DC-DC converter of claim 14, wherein the first single inductor has a higher open circuit inductance than each separate winding of the coupled inductor.

* * * * *